United States Patent
Bahl

(10) Patent No.: US 7,608,471 B2
(45) Date of Patent: Oct. 27, 2009

(54) METHOD AND APPARATUS FOR INTEGRATING III-V SEMICONDUCTOR DEVICES INTO SILICON PROCESSES

(75) Inventor: Sandeep R. Bahl, Palo Alto, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 45 days.

(21) Appl. No.: 11/199,663

(22) Filed: Aug. 9, 2005

(65) Prior Publication Data
US 2007/0037362 A1    Feb. 15, 2007

(51) Int. Cl.
*H01L 21/00* (2006.01)
(52) U.S. Cl. ............... 438/35; 438/33; 438/46; 438/483; 438/458; 257/E33.001
(58) Field of Classification Search .......... 438/22, 438/46–47, 455, 483, 35, 33, 458; 257/E33.001
See application file for complete search history.

(56) References Cited

U.S. PATENT DOCUMENTS

| | | | |
|---|---|---|---|
| 5,578,162 A * | 11/1996 | D'Asaro et al. ............. 257/85 | |
| 6,448,102 B1 | 9/2002 | Kneissl et al. | |
| 6,562,648 B1 | 5/2003 | Wong et al. | |
| 6,746,889 B1 * | 6/2004 | Eliashevich et al. ......... 438/33 | |
| 6,757,314 B2 | 6/2004 | Kneissl et al. | |
| 6,790,695 B2 * | 9/2004 | Ogihara et al. ............. 438/33 | |
| 6,974,758 B2 * | 12/2005 | Kelly et al. ............... 438/458 | |
| 2002/0096994 A1 * | 7/2002 | Iwafuchi et al. ........... 313/495 | |
| 2005/0042845 A1 * | 2/2005 | Urbanek ................... 438/483 | |
| 2005/0066883 A1 | 3/2005 | Dubrow et al. | |
| 2005/0150936 A1 | 7/2005 | Mackay | |
| 2006/0211159 A1 | 9/2006 | Bruederl et al. | |

FOREIGN PATENT DOCUMENTS

| WO | WO 2005/004231 | 1/2005 |
|---|---|---|
| WO | WO 2005/024908 | 3/2005 |

OTHER PUBLICATIONS

Miskys et al., "Freestanding GaN-substrates and devices", phys. Stat. Sol.(c)0, No. 6, (2003) DOI10.1002/pssc.200303140, Jun. 27, 2003, pp. 1627-1650.
Chen et al., "Blue light-emitting diode fabrication of an InGaN/GaN epilayer bonded on a Si substrate by laser liftoff", CLEO Technical Digest, 2001 (2 pages).

* cited by examiner

*Primary Examiner*—Davienne Monbleau
*Assistant Examiner*—Matthew Reames

(57) ABSTRACT

Method and apparatus for fabricating semiconductor devices, for example, III-V semiconductor devices, having a desired substrate, for example, a silicon substrate. A method for fabricating semiconductor devices includes providing a semiconductor wafer that includes a plurality of semiconductor structures attached to a native substrate formed of a first substrate material, and a host substrate formed of a second substrate material. At least one subset of semiconductor structures of the plurality of semiconductor structures is transferred from the semiconductor wafer to the host substrate to provide a semiconductor device having a substrate formed of the second substrate material.

5 Claims, 3 Drawing Sheets

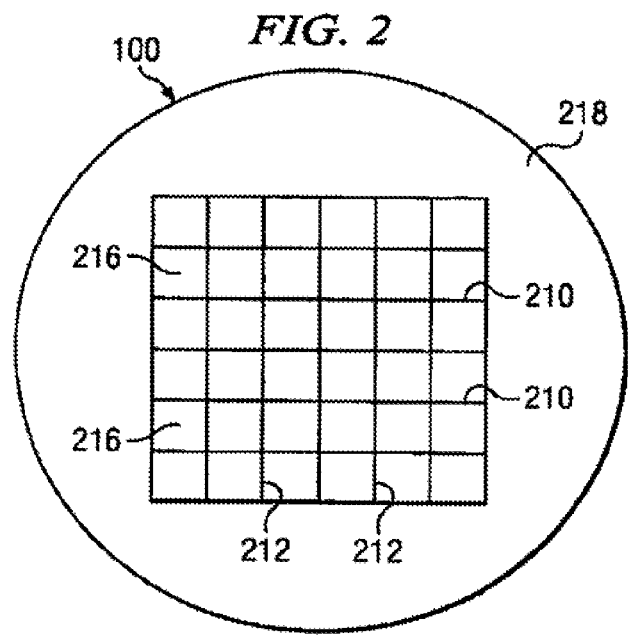
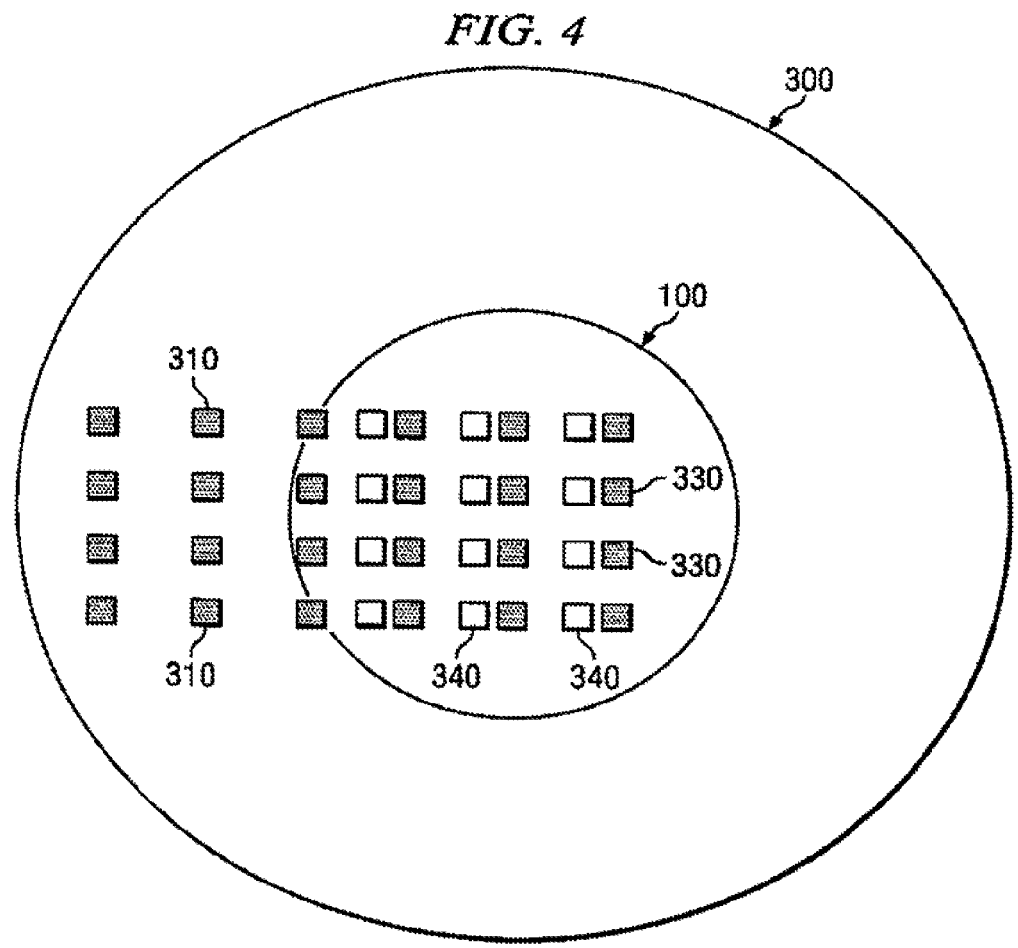

US 7,608,471 B2

METHOD AND APPARATUS FOR INTEGRATING III-V SEMICONDUCTOR DEVICES INTO SILICON PROCESSES

DESCRIPTION OF RELATED ART

II-V semiconductors are fabricated using elements from the third and fifth groups of the periodic table, for example, GaAs, GaN and InP. Usually, GaN devices are fabricated by growing an epitaxial layer on a sapphire substrate because sapphire has been found to be most cost-effective in achieving high quality crystal growth. A III-V semiconductor having a silicon substrate, however, would combine high-speed operation for both optics and electronics achievable with III-V devices with high functionality and low-cost circuitry offered by silicon.

Growing GaAs and InP directly on Si has met with only mixed success because, in general, the approach is not compatible with CMOS fabrication processes due to both the high temperature required to desorb $SiO_2$ and because the III-V film will decompose at the temperatures required for CMOS processing. In wafer bonding approaches, a III-V film is grown on a native substrate such as sapphire, InP or GaAs, and the entire III-V film is then bonded onto a host substrate, i.e., a silicon substrate. The native substrate is then removed to provide a III-V device having a silicon substrate. Wafer bonding approaches have problems with respect to material wastage and thermal mismatch. Integrating III-V devices with silicon-based processes by fabricating the III-V device separately, and then using a pick-and-place machine to position the device at a predetermined location on a silicon die to be attached to the silicon, allows one to use optimized processes for fabricating both the silicon and the III-V device, and also prevents wastage of the III-V film; however, typical pick-and-place machines are not able to handle structures having a size less than about 200 μm on a side; and this results in wasting both III-V and substrate area.

SUMMARY OF THE INVENTION

A method and apparatus for fabricating semiconductor devices, for example, III-V semiconductor devices, having a desired substrate, for example, a silicon substrate. A method for fabricating semiconductor devices in accordance with the invention includes providing a semiconductor wafer that includes a plurality of semiconductor structures attached to a native substrate formed of a first substrate material, and a host substrate formed of a second substrate material. At least one subset of semiconductor structures of the plurality of semiconductor structures is transferred from the semiconductor wafer to the host substrate to provide a semiconductor device having a substrate formed of the second substrate material.

BRIEF DESCRIPTION OF THE DRAWINGS

Furthermore, the invention provides embodiments and other features and advantages in addition to or in lieu of those discussed above. Many of these features and advantages are apparent from the description below with reference to the following drawings.

FIG. 2 is a schematic top view of the III-V semiconductor wafer of FIG. 1 illustrating the addition of scribe lines thereon according to an exemplary embodiment in accordance with the invention;

FIG. 4 is a schematic top view of the silicon substrate of FIG. 3 illustrating the transfer of a second subset of III-V semiconductor structures to the silicon substrate according to an exemplary embodiment in accordance with the invention.

DETAILED DESCRIPTION OF THE EXEMPLARY EMBODIMENTS OF THE INVENTION

Exemplary embodiments in accordance with the invention provide a method and apparatus for fabricating semiconductor devices, such as III-V semiconductor devices, having a desired substrate, for example, a silicon substrate.

Figure 1:
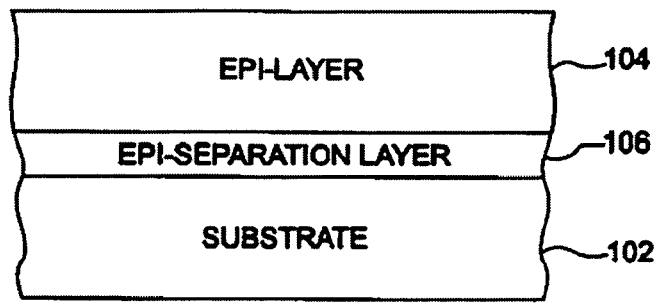
FIG. 1 is a schematic cross-sectional side view of a portion of a III-V semiconductor wafer according to an exemplary embodiment in accordance with the invention.

FIG. 1 is a schematic cross-sectional side view of a portion of a III-V semiconductor wafer according to an exemplary embodiment in accordance with the invention. The semiconductor wafer is generally designated by reference number 100, and includes substrate 102, epitaxial layer (epi-layer) 104 and epitaxial separation layer (epi-separation layer) 106. In the exemplary embodiment in accordance with the invention illustrated in FIG. 1, semiconductor wafer 100 comprises a III-V semiconductor wafer, substrate 102 comprises a sapphire substrate and epi-layer 104 comprises one or more GaN-based compounds such as GaN, AlGaN, AlN, InN, InGaN, InAlGaN, or the like. It should be understood, however, that semiconductor wafer 100 can be formed of other materials, including other semiconductor materials and other substrate materials, and it is not intended to limit the invention to a semiconductor wafer formed of any particular materials.

Epi-separation layer 106 is selected to have a property that allows for the separation of epi-layer 104 from substrate 102. According to an exemplary embodiment in accordance with the invention, epi-separation layer 106 is formed of a material that has a much higher absorption coefficient for laser light than the material of sapphire substrate 102, for example, GaN. In particular, in the case of a GaN epi-separation layer on a sapphire substrate, a third harmonic YAG laser pulse will cause the decomposition of the GaN layer, thus permitting epi-layer 104 to be easily separated from substrate 102. An excimer laser may also be used.

Epi-separation layer 106 can also be of a material that has the property of a highly selective etching behavior to enable separation of epi-layer 104 from substrate 102, and it should be understood that it is not intended to limit the invention to an epi-separation layer having any particular separation-enabling property.

III-V semiconductor wafer 100 is fabricated by growing epi-separation layer 106 on sapphire substrate 102; and, thereafter, growing epi-layer 104 on epi-separation layer 106. In general, III-V semiconductor wafer 100 is fabricated using standard fabrication processes under optimal fabrication conditions.

Following the fabrication of III-V semiconductor wafer 100, scribe lines are etched through epi-layer 104 and epi-separation layer 106 of wafer 100 down to substrate 102. FIG. 2 is a schematic top view of the III-V semiconductor wafer of FIG. 1 illustrating the addition of scribe lines thereon according to an exemplary embodiment in accordance with the invention. The scribe lines comprise a first plurality of horizontal scribe lines 210 and a second plurality of vertical scribe lines 212 that intersect to define a plurality of individual III-V semiconductor structures 216 arranged in a checkered pattern. As will be explained in detail hereinafter, scribe lines 210 and 212 permit semiconductor structures 216 to be selectively transferred from substrate 102 to a different substrate.

According to an exemplary embodiment in accordance with the invention, scribe lines 210 and 212 define a plurality of square semiconductor structures 216 having dimensions of about 50μ by about 50μ, although it should be understood that this is intended to be exemplary only as structures 216 can be formed to have any desired shape and size. Also according to an exemplary embodiment in accordance with the invention, semiconductor wafer 100 comprises a circular wafer having a diameter of about 2 to about 6 inches such that an array of about 100 to about 1000 rows and columns of individual III-V structures having a size of about 50μ by about 50μ can be formed thereon by the scribe lines. It should again be understood, however, that the shape and dimensions of semiconductor wafer 100 can also be varied without departing from the scope of the invention.

Preferably also, epi-layer 104 and epi-separation layer 106 are etched down to substrate 102 in area 218 of wafer 100 that surrounds the grid of individual III-V structures 216. As will be explained hereinafter, this helps prevent III-V structures along the wafer edge from bumping into structures that have previously been transferred from substrate 102 to a different substrate.

Figure 3:
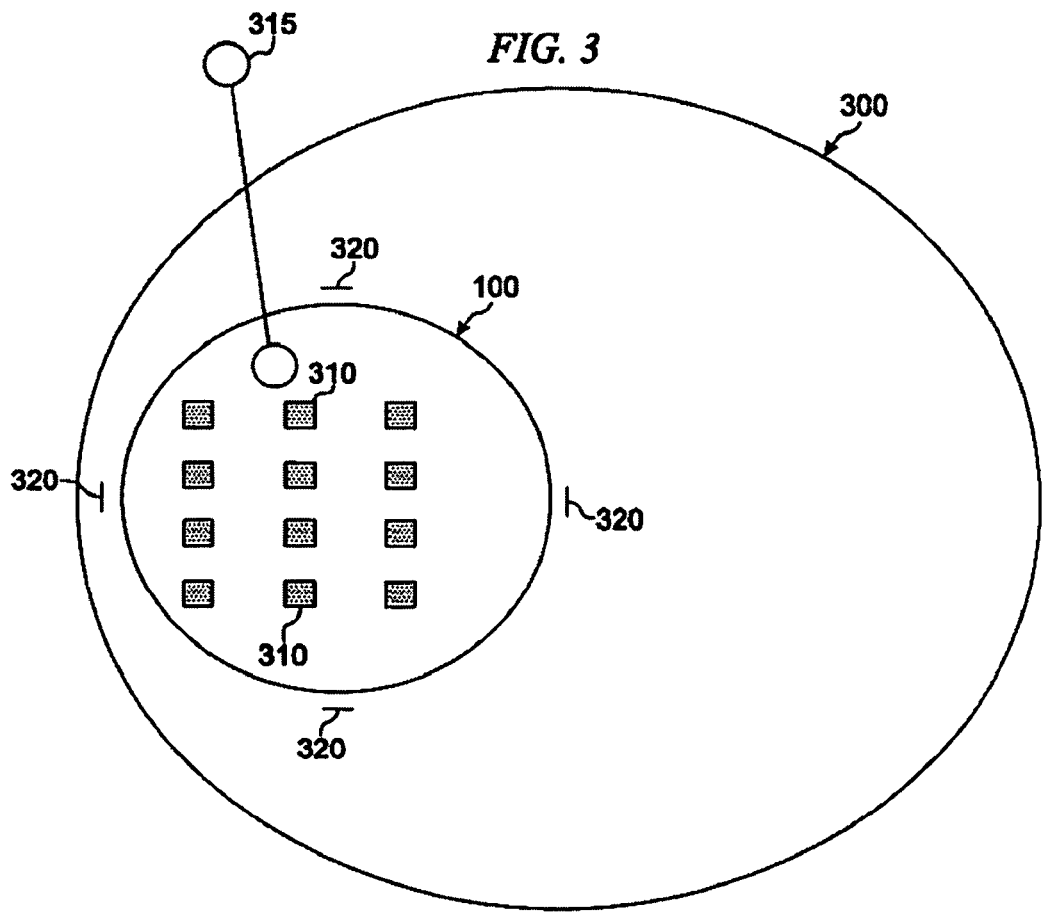
FIG. 3 is a schematic top view illustrating the transfer of a subset of III-V semiconductor structures to a silicon substrate according to an exemplary embodiment in accordance with the invention.

FIG. 3 is a schematic top view illustrating the transfer of a subset of III-V semiconductor structures to a silicon substrate according to an exemplary embodiment in accordance with the invention. The silicon substrate is designated by reference number 300, and is fabricated separately from the fabrication of III-V semiconductor wafer 100 described with reference to FIGS. 1 and 2, using standard silicon substrate fabrication processes under optimal fabrication conditions, with the exception of the added step of building-up metallic pads on the surface of substrate 300 at locations at which III-V structures 216 on semiconductor wafer 100 are to be transferred as will be explained in detail hereinafter. In general, III-V structures 216 can be transferred to silicon substrate 300 at any time after all high temperature processing steps in the silicon substrate fabrication process have been completed and after the metal pads have been built-up on the silicon substrate.

After fabrication of both semiconductor wafer 100 and silicon substrate 300, III-V structures 216 can then be transferred from semiconductor wafer 100 to silicon substrate 300. According to an exemplary embodiment in accordance with the invention, the transfer is achieved in a manner that allows efficient utilization of both the III-V epi-layer and the surface of the silicon substrate. In particular, the silicon circuitry is initially laid out such that bonding spots for the III-V semiconductor structures will be periodic. One suitable space-filling periodic placement is, for example, the Bravais lattice. As indicated above, the surface of the silicon substrate is metallized by a metal such as a Pb—Sn alloy, at locations where the III-V structures are to be transferred to the silicon substrate. Other areas of the silicon substrate are covered with dielectric material such as silicon dioxide or silicon nitride. A polyamide or BCB film may also be used. The metal bonding pads may also be built up on top of the film covering the Si substrate, rather than directly on the Si. III-V semiconductor wafer 100 is then flipped over such that III-V epi-layer 104 faces downwardly, and the semiconductor wafer is positioned on the silicon substrate at a desired location on the silicon substrate using alignment marks, such as alignment marks 320 illustrated in FIG. 3, on silicon substrate 300. Placement of III-V semiconductor wafer 100 on silicon substrate 300 can be accomplished, for example, by using pick-and-place machine 315 inasmuch as semiconductor wafer 100 is sufficiently large to be easily handled by such machine 315.

After semiconductor wafer 100 has been properly positioned, the wafer is heated and then cooled to fuse those III-V structures of the plurality of III-V structures on semiconductor wafer 100 that have been selected for transfer to the silicon substrate, and that are aligned with the metallized bonding areas on the silicon substrate, to the silicon substrate. Those III-V structures on semiconductor wafer 100 that are not aligned with the metallized bonding areas, i.e., that are aligned with dielectric areas on the silicon substrate, will not be bonded to the silicon substrate.

Following fusing of the III-V structures selected for transfer to the silicon substrate, focused laser pulses are delivered through sapphire substrate 102 to decompose epi-separation layer 106 at the locations of the selected III-V structures, and the III-V semiconductor wafer is then lifted off of the silicon substrate. The selected III-V structures, inasmuch as they are no longer attached to the sapphire substrate of the semiconductor wafer, will remain attached to the silicon substrate at the selected locations to provide a plurality of III-V semiconductor devices having a silicon substrate.

According to an exemplary embodiment in accordance with the invention, the III-V structures selected for transfer to the silicon substrate comprise a subset of the plurality of III-V structures on semiconductor wafer 100. In the exemplary embodiment in accordance with the invention illustrated in FIG. 3, the subset comprises a subset of twelve III-V semiconductor structures 310 arranged in a 3×4 array of III-V semiconductor structures, and spaced from one another by a desired distance. This is intended to be exemplary only as any one or more of the plurality of III-V structures on semiconductor wafer 100 can be selected to define a sub-set of III-V semiconductor structures to be transferred to silicon substrate 300. In general, the numbers and arrangement of the III-V semiconductor structures selected for a subset and the location at which the subset is positioned on the silicon substrate is selected to enable most efficient use of both silicon substrate and III-V devices.

Following transfer of a subset of III-V semiconductor structures from semiconductor wafer 100 to silicon substrate 300 as described above, wafer 100 is then positioned at a second location on silicon substrate 300, and a second subset of III-V semiconductor structures is transferred to silicon substrate 300.

FIG. 4 is a schematic top view of the silicon substrate of FIG. 3 illustrating the transfer of a second subset of III-V semiconductor structures to the silicon substrate according to an exemplary embodiment in accordance with the invention. As shown in FIG. 4, a second subset of III-V semiconductor structures 330 is transferred to silicon substrate 300 at locations displaced from the locations at which III-V structures 310 were previously transferred (Areas 340 in FIG. 4 represent locations on III-V semiconductor wafer 100 from which III-V semiconductor structures 310 were previously removed). The steps of aligning the III-V semiconductor wafer, of bonding the selected second subset of III-V semiconductor structures to metallized bonding areas on the silicon substrate, and the subsequent separation of the selected second subset of III-V structures from the III-V semiconductor wafer and removal of the wafer are repeated at the second location. The III-V semiconductor wafer can then be positioned at yet further locations on the silicon substrate to transfer further subsets of the plurality of III-V semiconductor structures from III-V semiconductor wafer 100 to silicon substrate 300. The process can be repeated as many times as desired or until the silicon wafer has been filled or until all the III-V semiconductor structures on III-V semiconductor wafer 100 have been transferred. As mentioned previously, epi-layer 104 and epi-separation layer 106 were previously etched down to substrate 102 in area 218 of wafer 100 that surrounds the grid of individual III-V structures 216 to prevent III-V structures along the wafer edge from bumping into structures that have previously been transferred to the silicon substrate during these subsequent transfer operations.

In general, since the III-V substrate is smaller than the silicon substrate, and the silicon substrate is capable of receiving III-V structures over substantially its entire surface, transfers of multiple subsets of the III-V semiconductor structures to silicon substrate 300 permits more efficient use of both the III-V epi-layer and the silicon substrate. In addition, by transferring the semiconductor structures to the silicon substrate in batches of semiconductor structures, the transfer process is more efficient and can use conventional pick-and-place machines to assist in the transfer.

Figure 5:
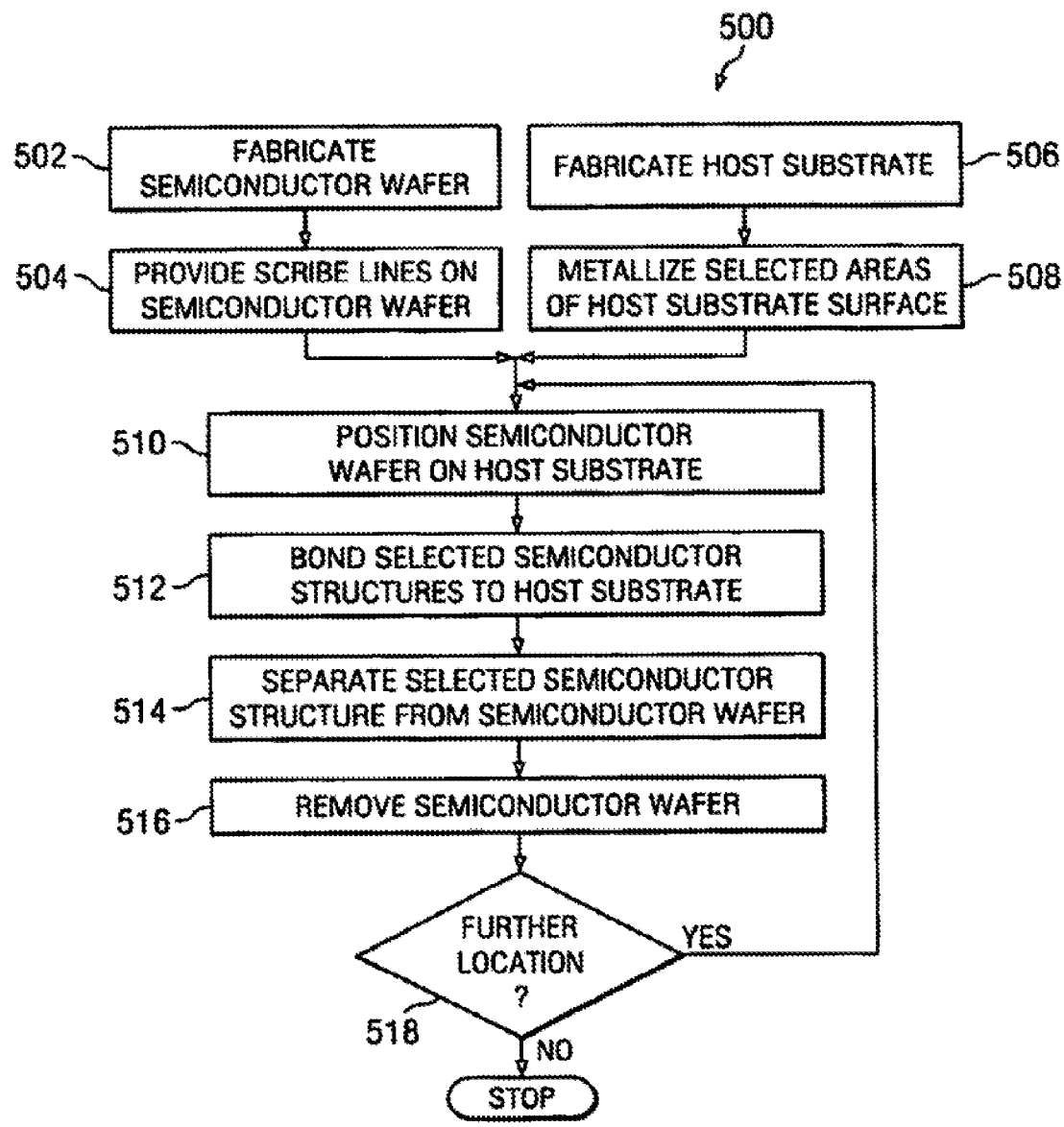
FIG. 5 is a flowchart that illustrates a method for fabricating semiconductor devices according to an exemplary embodiment in accordance with the invention.

FIG. 5 is a flowchart that illustrates a method for fabricating semiconductor devices according to an exemplary embodiment in accordance with the invention. The method is generally designated by reference number 500, and begins by separately fabricating a semiconductor wafer that includes a native substrate, an epi-layer, and an epi-separation layer between the native substrate and the epi-layer (Step 502); and a host substrate to which semiconductor structures are to be transferred from the semiconductor wafer (Step 506). Scribe lines are provided on the semiconductor wafer that extend through the epi-layer and the epi-separation layer down to the native substrate to define a plurality of semiconductor structures on the semiconductor wafer (Step 504); and selected areas on the host substrate are metallized to receive selected semiconductor structures to be transferred from the semiconductor wafer to the host substrate (Step 508).

The semiconductor wafer is then positioned at a desired location on the host substrate (Step 510), and a selected subset of the semiconductor structures on the semiconductor wafer is bonded to metallized areas on the host substrate (Step 512). The selected subset of semiconductor structures is then separated from the native substrate on the semiconductor wafer (Step 514), and the semiconductor wafer is removed (Step 516) leaving the selected subset of semiconductor structures attached to the host substrate.

A determination is then made whether there is a further location on the host substrate at which semiconductor structures are to be transferred to the host substrate (Step 518). If there is no further location (No output of Step 518), the method ends. If there is a further location (Yes output of Step 518), the method returns to step 510, the semiconductor wafer is positioned at the further location, and Steps 512-516 are repeated at the further location.

While what has been described constitute exemplary embodiments in accordance with the invention, it should be recognized that the invention can be varied in numerous ways without departing from the scope thereof. Because exemplary embodiments in accordance with the invention can be varied in numerous ways, it should be understood that the invention should be limited only insofar as is required by the scope of the following claims.

I claim:

1. A system for fabricating silicon substrate semiconductor devices comprising III-V semiconductor structures, comprising:

a semiconductor wafer comprising a sapphire substrate, a separation layer, and an epitaxial layer disposed above the separation layer, a plurality of III-V semiconductor structures being formed in the epitaxial layer and arranged atop and attached too the separation layer, each of the plurality of III-V semiconductor structures being separated from the other III-V semiconductor structures by score lines etched therebetween and down to the underlying sapphire substrate through the separation layer disposed between the epitaxial layer and the sapphire substrate;

a host substrate comprising silicon;

a transfer mechanism configured to transfer, in succession, first and second subsets, respectively, of the plurality of III-V semiconductor structures from the semiconductor wafer to the host substrate, the transfer mechanism comprising means for positioning, in succession, the epitaxial layers and sapphire substrate corresponding to the first and second subsets of the semiconductor wafer such that the epitaxial layers face downwardly in respect of, and are positioned adjacent to, the silicon substrate, and means for aligning, in succession, each of the first and second subsets with corresponding metal bonding pads disposed at first and second locations on the silicon substrate, where the first location is different from the second location;

means for fusing, in succession, the epitaxial layers of the first and second subsets to the metal bonding pads disposed at the first and second locations on the silicon substrate, and focused laser pulse means for selectively decomposing, in succession, the separation layers disposed between the first and second subsets and the sapphire substrate, and means for removing from the silicon substrate those portions of the semiconductor wafer that are not fused to the silicon substrate.

2. The system according to claim 1, wherein the transfer mechanism further comprises a pick and lace machine.

3. The system according to claim 1, wherein the score lines define a plurality of substantially square or rectangular semiconductor structures.

4. The system according to claim 1, wherein the epitaxial layer comprises at least one GaN-based compound.

5. The system according to claim 4, wherein the at least one GaN-based compound is selected from the group consisting of GaN, AlGaN, AlN, InN, InGaN and InAlGaN.

* * * * *